US006143611A

United States Patent [19]
Gilton et al.

[11] Patent Number: 6,143,611
[45] Date of Patent: Nov. 7, 2000

[54] SEMICONDUCTOR PROCESSING METHODS, METHODS OF FORMING ELECTRONIC COMPONENTS, AND TRANSISTORS

[75] Inventors: Terry Gilton; David Korn, both of Boise, Id.

[73] Assignee: Micron Technology, Inc., Boise, Id.

[21] Appl. No.: 09/126,312

[22] Filed: Jul. 30, 1998

[51] Int. Cl.[7] .................................................. H01L 21/336
[52] U.S. Cl. ........................... 438/279; 438/301; 438/303
[58] Field of Search .................................... 438/301, 279, 438/625, 303, 261

[56] References Cited

U.S. PATENT DOCUMENTS

| | | | |
|---|---|---|---|
| 4,599,118 | 7/1986 | Han et al. | 148/1.5 |
| 4,786,609 | 11/1988 | Chen | 438/303 |
| 4,954,867 | 9/1990 | Hosaka | 357/52 |
| 4,971,655 | 11/1990 | Stefano et al. | 156/659.1 |
| 4,981,810 | 1/1991 | Fazan et al. | 437/44 |
| 5,126,283 | 6/1992 | Pintchovski | 438/396 |
| 5,219,777 | 6/1993 | Kang | 437/44 |
| 5,262,352 | 11/1993 | Woo et al. | 437/189 |
| 5,286,344 | 2/1994 | Blalock et al. | 156/657 |
| 5,290,720 | 3/1994 | Chen | 437/41 |
| 5,306,655 | 4/1994 | Kurimoto | 437/44 |
| 5,306,951 | 4/1994 | Lee et al. | 257/755 |
| 5,314,834 | 5/1994 | Mazure et al. | 437/43 |
| 5,322,807 | 6/1994 | Chen et al. | 437/40 |
| 5,334,556 | 8/1994 | Guldi | 437/248 |
| 5,371,026 | 12/1994 | Hayden | 438/275 |
| 5,382,533 | 1/1995 | Ahmad et al. | 437/24 |
| 5,420,800 | 5/1995 | Fukui | 364/491 |
| 5,430,313 | 7/1995 | Kumagai et al. | 257/327 |
| 5,439,846 | 8/1995 | Nguyen et al. | 437/187 |

(List continued on next page.)

FOREIGN PATENT DOCUMENTS

| | | |
|---|---|---|
| 58-25265 | 8/1981 | Japan . |
| 62-90974 | 10/1985 | Japan . |
| 1-073772 | 3/1989 | Japan . |

OTHER PUBLICATIONS

Wolf., S. et. al., "Silicon Processing For The VLSI Era", vol. 1, Lattice Press (1986), pp. 208 and 212.

Wolf, S., et. al., "Silicon Processing For the VLSI Era", vol. 1, Lattice Press (1986), pp. 216–218.

Wolf, S., et. al., "Silicon Processing For The VLSI Era", vol. II, Lattice Press, pp. 66–71.

*Primary Examiner*—John F. Niebling
*Assistant Examiner*—Walter L. Lindsay, Jr.
*Attorney, Agent, or Firm*—Wells, St. John, Roberts, Gregory & Matkin, P.S.

[57] ABSTRACT

In one implementation, first and second layers are formed over a substrate. One of the layers has a higher oxidation rate than the other when exposed to an oxidizing atmosphere. The layers respectively have an exposed outer edge spaced inside of the substrate periphery. Etching is conducted into the higher oxidation rate material at a faster rate than any etching which occurs into the lower oxidation rate material. Then, the substrate is exposed to the oxidizing atmosphere. In another implementation, a stack of at least two conductive layers for an electronic component is formed. The two conductive layers have different oxidation rates when exposed to an oxidizing atmosphere. The layer with the higher oxidation rate has an outer lateral edge which is recessed inwardly of a corresponding outer lateral edge of the layer with the lower oxidation rate. The stack is exposed to the oxidizing atmosphere effective to grow an oxide layer over the outer lateral edges of the first and second layers. In yet another implementation, a transistor comprises a semiconductive substrate and a gate stack formed thereover. The stack in at least one cross section defines a channel length within the substrate of less than 1 micron, with the stack comprising conductive material formed over a gate dielectric layer. An insulative layer is formed on outer lateral edges of the conductive material, with such layer having opposing substantially continuous straight linear outer lateral edges over all conductive material of the gate stack within the one cross section.

33 Claims, 3 Drawing Sheets

U.S. PATENT DOCUMENTS

| | | | |
|---|---|---|---|
| 5,476,802 | 12/1995 | Yamazaki et al. | 437/21 |
| 5,491,100 | 2/1996 | Lee et al. | 437/41 |
| 5,545,578 | 8/1996 | Park et al. | 437/44 |
| 5,552,329 | 9/1996 | Kim et al. | 437/29 |
| 5,552,332 | 9/1996 | Tseng | 438/143 |
| 5,637,514 | 6/1997 | Jeng | 438/163 |
| 5,668,028 | 9/1997 | Bryant | 438/287 |
| 5,714,413 | 2/1998 | Brigham et al. | 438/301 |
| 5,739,066 | 4/1998 | Pan | 438/595 |
| 5,897,353 | 4/1999 | Kim et al. | 438/261 |
| 5,994,192 | 11/1999 | Chen | 438/303 |
| 6,037,228 | 2/2000 | Hsu | 438/279 |
| 6,040,241 | 3/2000 | Lee et al. | 438/622 |

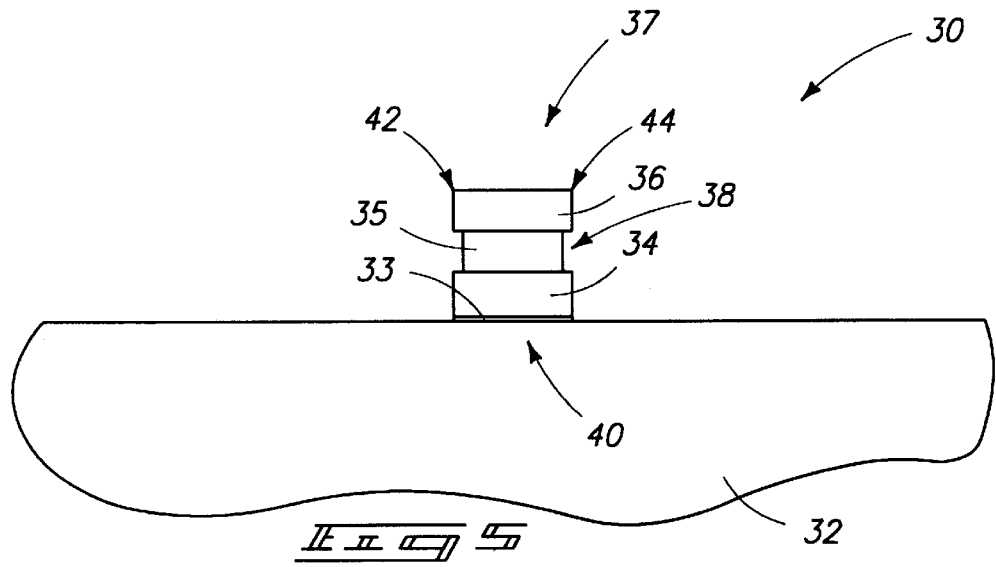
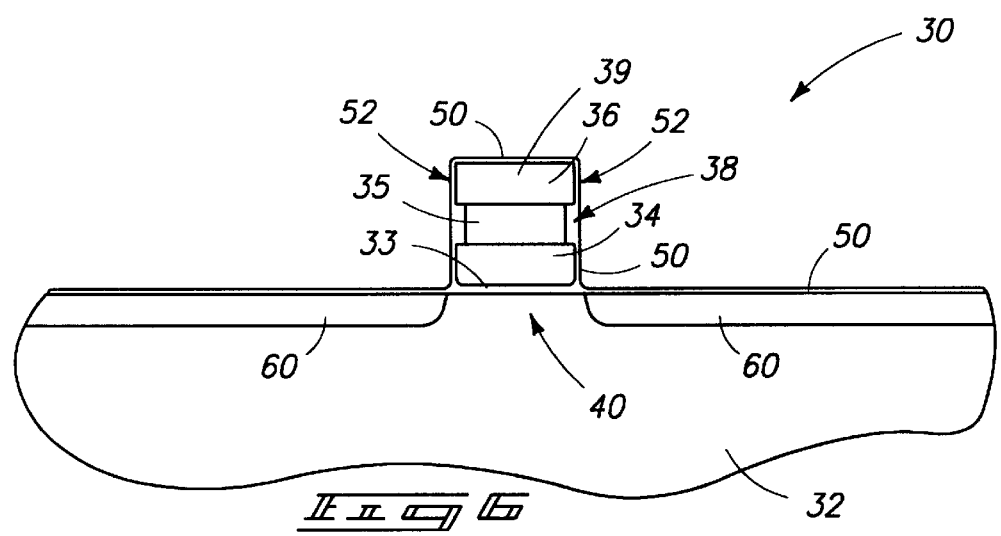
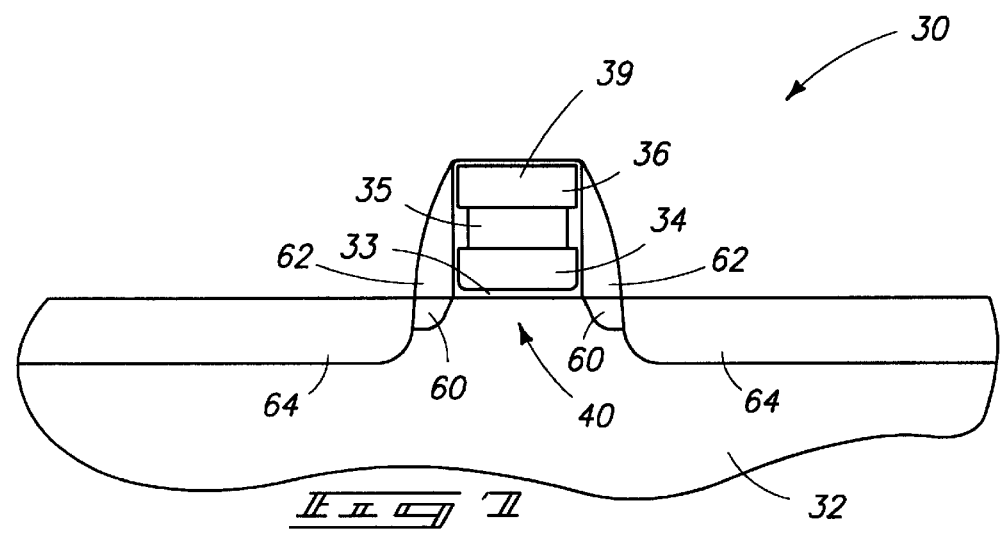

SEMICONDUCTOR PROCESSING METHODS, METHODS OF FORMING ELECTRONIC COMPONENTS, AND TRANSISTORS

TECHNICAL FIELD

This invention relates to semiconductor processing methods, including methods of fabricating electronic components such as transistors.

BACKGROUND OF THE INVENTION

Field effect transistors are comprised of a pair of diffusion regions, referred to as a source and a drain, spaced apart within a semiconductive substrate. The transistors include a gate provided adjacent a substrate separation region between the diffusion regions for imparting an electric field to enable current to flow between the diffusion regions. The substrate material adjacent the gate and between the diffusion regions is referred to as the channel.

The semiconductive substrate typically comprises bulk crystalline silicon having a light conductivity doping impurity concentration of opposite type to the predominate doping of the source and drain regions. Alternately, the substrate can be provided in the form of a thin layer of lightly doped semiconductive material over an underlaying insulating layer. Such are commonly referred to as semiconductor-on-insulator (SOI) constructions. In the context of this document, the term "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

Integrated circuitry fabrication technology continues to strive to increase circuit density, and thereby minimize the size and channel lengths of field effect transistors. Improvements in technology have resulted in reduction of field effect transistor size from long-channel devices (i.e., channel lengths greater than two microns), to short-channel devices (i.e., channel lengths less than two microns), and to sub-micron devices (i.e., channel lengths less than one micron). As field effect transistor channel lengths (i.e., gate or word line widths) became smaller than two microns, so-called short-channel effects began to become increasingly significant. As a result, device design and consequently process technology had to be modified to take these effects into account so that optimum device performance could continue to be obtained. For example, the lateral electrical field in the channel region increases as a result of smaller transistor channel lengths as the supply voltage remains constant. If the field becomes strong enough, it can give rise to so-called hot-carrier effects. Hot-carrier effects often lead to gate oxide degradation, as energetic carriers can be injected into gate oxide and become permanent charges.

Two recognized solutions to this problem, used either alone or in combination, include source/drain re-oxidation and provision of lightly doped drain (LDD) regions. Source/drain re-oxidation effectively grows a layer of thermal oxide over the source and drain areas as well as over the gate sidewalls. The oxidation has the effect of rounding the poly gate edge corners in effectively oxidizing a portion of the gate and underlying substrate, thereby increasing the thickness of the gate oxide layer at least at the edges of the gate. Such reduces the gate-to-drain overlap capacitance, and strengthens the gate oxide of the polysilicon gate edge. The latter benefits are effectively obtained because oxidation-induced encroachment gives rise to a graded gate oxide under the polysilicon edge. The thicker oxide at the gate edge relieves the electric-field intensity at the corner of the gate structure, thus reducing short-channel effects.

An example technique for accomplishing such re-oxidation includes conventional wet and dry oxidations at atmospheric pressure and at a temperature of 800° C. or greater. Typical process exposure time is 10 minutes, which also grows a layer of oxide from 50 to 200 Angstroms thick on the sidewalls of the patterned gate.

LDD regions are provided within the substrate relative to the channel region in advance of the source and drains, and further reduce hot-carrier effects. The LDD regions are provided to be lighter conductively doped (i.e., less concentration) than the source and drain regions. This facilitates sharing the voltage drop between the drain and the channel, as opposed to the stark voltage drop at the channel occurring in non-LDD transistors. The LDD regions absorb some of the voltage drop potential into the drain, thus effectively eliminating hot-carrier effects. As a result, the stability of the device is increased.

Most commonly, a combination of source/drain re-oxidation and formation of LDD regions is utilized. However in combination, these processes can create problems, particularly in fabrication of sub-micron devices.

For example, consider FIGS. 1–2. FIG. 1 depicts a semiconductor wafer fragment 10 comprised of a bulk monocrystalline substrate 12 having a gate structure 14 formed thereover. Gate 14 comprises a gate oxide layer 16, an overlying conductively doped polysilicon layer 18, an overlying refractory metal silicide layer 20, and an insulative cap 22, such as $Si_3N_4$. That region beneath gate oxide layer 16 within bulk substrate 12 will constitute the channel region of the resultant transistor. Unfortunately when subjected to source/drain re-oxidation, the differing materials of gate 14 do not oxidize at the same rate. FIG. 2 illustrates an oxide layer 24 formed over substrate 12 and the sidewalls of gate structure 14 after a source/drain re-oxidation. Silicide layer 20 of gate structure 14 has a tendency to oxidize at a significantly greater rate than the oxidation of either nitride layer 22 or polysilicon layer 18. Such results in the formation of the illustrated sidewall bulges 25.

The typical manner by which LDD regions are fabricated is by ion implantation of conductivity dopant impurity after source/drain re-oxidation, such as regions 26. Unfortunately, oxide bulges 25 in layer 24 effectively function as a mask to such ion implantation. This results in formation of LDD implant regions 26 being laterally spaced outwardly away from the original sidewalls of gate structure 14. This is undesirable. More preferably, the inner lateral edges of LDD regions 26 are desirably as close to the gate edges as possible.

The invention was principally motivated in overcoming drawbacks such as that described above with respect to field effective transistors fabrication. The artisan will, however, appreciate applicability of the following invention to other aspects of semiconductor wafer processing in formation of other electronic components or devices, with the invention only being limited by the accompanying claims appropriately interpreted in accordance with the Doctrine of Equivalents.

SUMMARY OF THE INVENTION

The invention comprises semiconductor processing methods, methods of forming electronic components, and transistors. In one implementation, first and second layers are formed over a substrate. One of the layers has a higher oxidation rate than the other when exposed to an oxidizing atmosphere. The substrate has a periphery. The layers, respectively, have an exposed outer edge spaced inside the substrate periphery. Etching is conducted into the higher oxidation rate material at a faster rate than any etching which occurs into the lower oxidation rate material. After the etching, the substrate is exposed to the oxidizing atmosphere.

In but one other implementation, a stack of at least two conductive layers for an electronic component is formed over a substrate. The two conductive layers have different oxidation rates when exposed to an oxidizing atmosphere. The layer with the higher oxidation rate has an outer lateral edge which is recessed inwardly of a corresponding outer lateral edge of the layer with the lower oxidation rate. The stack of conductive layers is exposed to the oxidizing atmosphere effective to grow an oxide layer over the outer lateral edges of the first and second layers.

In but one other implementation, a transistor comprises a semiconductive substrate and a gate stack formed thereover. The gate stack in at least one cross section defines a channel length within the semiconductive substrate of less than 1 micron, with the gate stack comprising conductive material formed over a gate dielectric layer. An insulative layer is formed on outer lateral edges of the conductive material, with the insulative layer having opposing substantially continuous straight linear outer lateral edges over all conductive material of the gate stack within the one cross section.

BRIEF DESCRIPTION OF THE DRAWINGS

Preferred embodiments of the invention are described below with reference to the following accompanying drawings.

FIG. 5 is a view of the FIG. 3 wafer fragment at a processing step subsequent to that shown by FIG. 4.

FIG. 6 is a view of the FIG. 3 wafer fragment at a processing step subsequent to that shown by FIG. 5.

FIG. 7 is a view of the FIG. 3 wafer fragment at a processing step subsequent to that shown by FIG. 6.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 3:
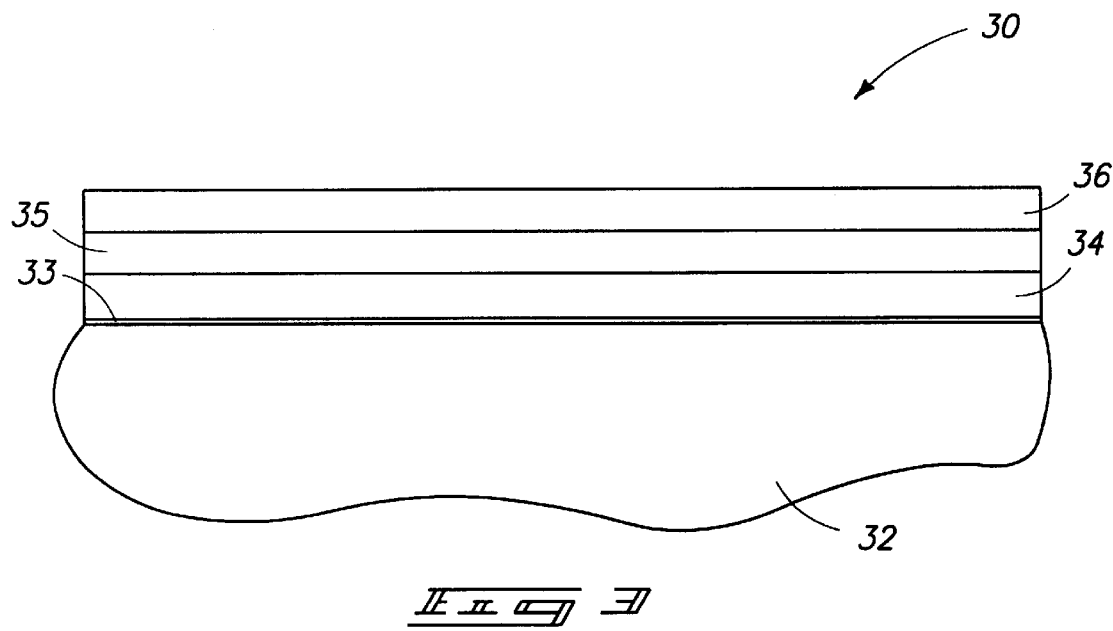
FIG. 3 is a diagrammatic sectional view of a semiconductor wafer fragment at one processing step in accordance with the invention.

Referring initially to FIG. 3, a semiconductor wafer fragment 30 comprises a bulk monocrystalline silicon substrate 32. A gate dielectric layer 33 (i.e., $SiO_2$), a conductively doped silicon layer 34 (i.e., polysilicon), a silicide layer 35 (i.e., a refractory metal silicide, such as $WSi_x$) and an insulating layer 36 (i.e., doped or undoped $SiO_2$, $Si_3N_4$, etc.) are formed over monocrystalline substrate 32. Silicide layer 35 has a higher oxidation rate than oxidation rates of layers 34 and 36 when exposed to an oxidizing atmosphere, with an example oxidizing atmosphere being oxygen gas at a temperature of about 950° C.

Figure 4:
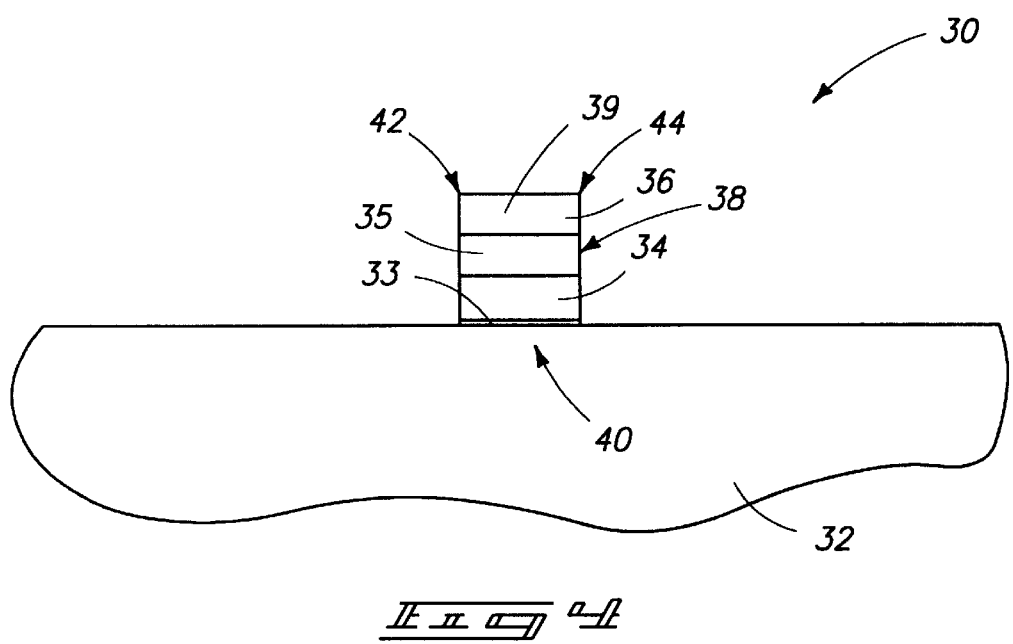
FIG. 4 is a view of the FIG. 3 wafer fragment at a processing step subsequent to that shown by FIG. 3.

Referring to FIG. 4, insulating layer 36, silicide layer 35, doped silicon layer 34, and gate dielectric layer 33 are patterned and etched (i.e., by photolithography) to form a conductive gate stack 38 (having an insulating cap 39) over a channel region 40 of substrate 32. The preferred technique for forming the illustrated stack is by dry etching, for example, using chemistries comprising $CH_4/CHF_3$ for the insulative cap, $NF_3/Cl_2$ for the silicide, and $Cl_2/HBr$ for the polysilicon. Gate stack 38 comprises two opposing and respectively linearly aligned outer lateral edges 42 and 44 of the insulating silicide and doped silicon layers. Accordingly or alternately considered, layers 34 and 35 constitute first and second layers (both being conductive in this example) formed over a substrate, with the second layer being formed over the first and having a higher oxidation rate than the first when exposed to a certain oxidizing atmosphere. Although layer 35 is shown received over layer 34, the relationship might be reversed depending on the processor's desire and the component being fabricated. The first and second conductive materials in this example have been etched to form a conductive component, here in the form of a transistor gate 38. The substrate has a periphery (outside of the cross-sectional views of FIGS. 3–7), with first layer 34 having an exposed first outer edge (i.e., either edge 42 or 44) spaced inside the substrate periphery, and with second layer 35 having an exposed first outer edge (i.e., either edge 42 or 44) spaced inside the substrate periphery.

Layer 36 (cap 39) comprises a third layer formed over the first and second layers, with itself having an exposed outer edge (i.e., either edge 42 or 44) spaced inside the substrate periphery. Third layer 36 has a lower oxidation rate than the oxidation rate of second layer 35 when exposed to the oxidizing atmosphere. The invention is believed to have its greatest applicability to electronic component device fabrication having widths less than 1 micron. Accordingly, the etching(s) to produce the FIG. 4 construction is ideally conducted to space opposing linear outer lateral edges 42 and 44 less than 1 micron apart from one another. Accordingly in the illustrated preferred embodiment where a transistor is being fabricated in the preferred sub-micron fabrication, the illustrated first conductive layer 34 is at least fabricated to have its opposing outer lateral edges spaced less than 1 micron apart. Such defines, in the illustrated cross-section, a channel length (i.e., minimum gate width) within channel region 40 of semiconductive substrate 32 of less than 1 micron.

Referring to FIG. 5, silicide layer 35 is etched at a faster rate than any etching into edges 42 and 44 of layers 36 and 34 to recess outer lateral edges of silicide layer 35 to within outer lateral edges of both layers 36 and 34 of the illustrated stack. Such produces conductive layers 34 and 35 within the illustrated cross-section to have respective opposing outer lateral edges which are displaced from one another. Accordingly, the outer lateral edge of the layer with the higher oxidation rate is recessed inwardly of corresponding outer lateral edges of the layers with lower oxidation rate in the particular oxidizing atmosphere.

The preferred etching is a wet etching, preferably with a basic solution. An example is a solution comprising ammonium hydroxide and hydrogen peroxide, with a specific example solution being ammonium hydroxide, $H_2O_2$, and $H_2O$ in a mix of 0.25:1:5 by volume. Example conditions for such etching include ambient pressure, a temperature ranging from 40° C. to 70° C. for from 1 to 10 minutes. Alternate bases (i.e., KOH) could be used in addition to or instead of ammonium hydroxide in the preferred basic wet etching. Such example chemistries can provide substantially selective etching of layer 35 relative to the etching of layers 36, 34, and substrate 32 if it is exposed. In the context of this document, "substantially selective" is to be interpreted to mean an etch rate of one material relative to another of at least 2:1.

Figure 1:
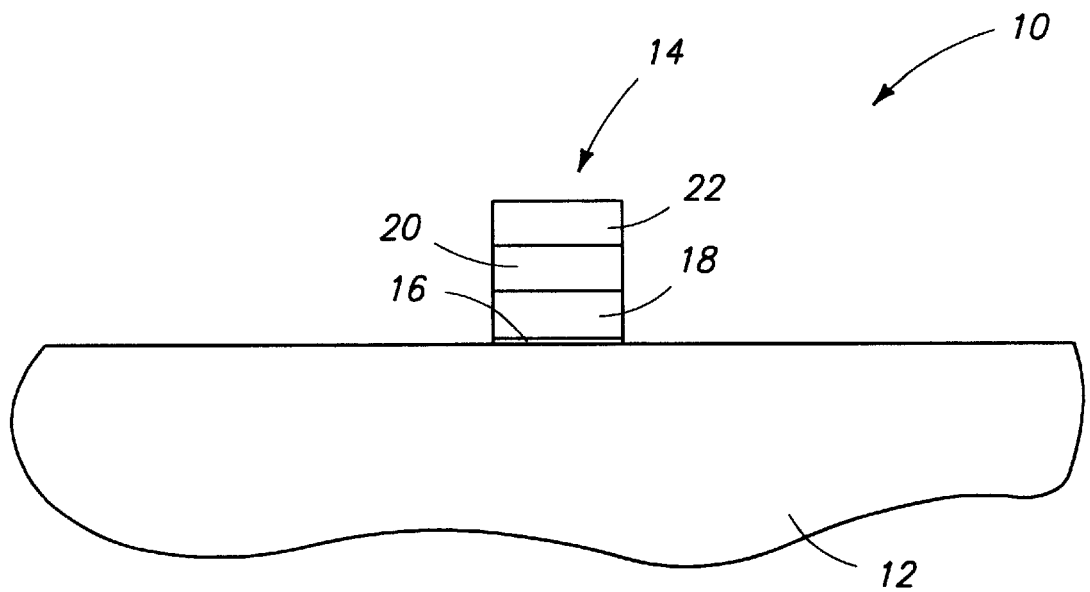
FIG. 1 is a diagrammatic sectional view of a prior art semiconductor wafer fragment at a prior art processing step, and is described in the "Background" section above.
Figure 2:
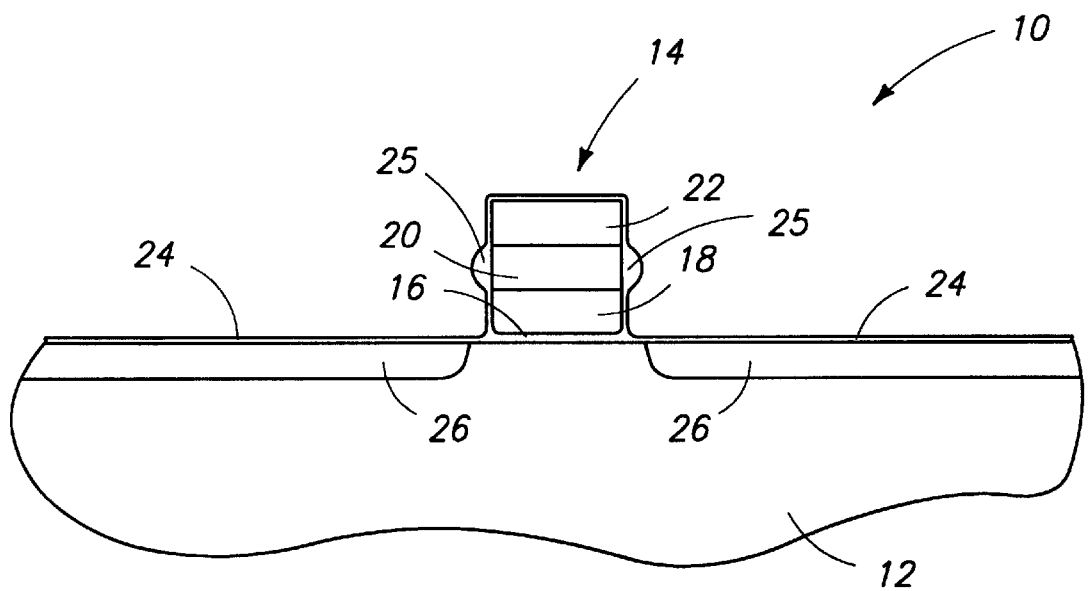
FIG. 2 is a view of the FIG. 1 wafer fragment at a prior art processing step subsequent to that show by FIG. 1.

Referring to FIG. 6, the substrate is exposed to the oxidizing atmosphere with a recessed edge of second layer 35 being exposed. In the preferred embodiment, this is conducted to be effective to grow an oxide layer 50 over outer lateral edges of silicide layer 35 and doped silicon layer 34. Such is also effective to form oxide layer 50 over silicon substrate 32 and even, to perhaps a lesser degree, over insulating cap 39. Thus, a recessed edge of layer 35 is oxidized. Preferably, layer 50 is formed to produce oxide layer 50 to have opposing substantially continuous straight linear outer lateral edges 52 at least over first and second conductive materials 35 and 34 (i.e., over all conductive material of the gate stack within at least the one illustrated cross-section). Regardless and ideally, the prior art FIG. 2 outward lateral bulges 25 do not occur. Oxide layer 50 ideally has a lateral thickness of less than 100 Angstroms and greater than 10 Angstroms over first conductive material 34. Further ideally in the application of the invention to ever increasingly sub-micron devices, opposing linear outer lateral edges 52 of oxide layer 50 are formed to be less than 1 micron in separated distance. Alternate insulating material layers 50 could also of course be utilized.

After the preferred oxidizing to form oxide layer 50, a suitable dopant impurity is ion implanted into substrate 32 proximate gate stack 38 to form one or more LDD regions, or halo regions, 60. Effective removal or prevention of formation of lateral bulges 25 of the FIG. 2 prior art can accordingly be utilized to position regions 60 more proximate the outer lateral edges of the gate stack, particularly in fabrication of sub-micron devices.

Referring to FIG. 7, insulative material is formed over oxide layer 50 and is subsequently anisotropically etched to produce insulative illustrated spacers 62. Subsequent ion implanting can then be conducted to provide dopant impurity into substrate 32 proximate the gate stack to form field effect transistor source/drain regions 64.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method of forming an electronic component comprising:
   forming first and second conductive materials over a substrate, the second material having a higher oxidation rate than an oxidation rate of the first material when exposed to a thermal oxidizing atmosphere;
   first etching the first and second conductive materials to form a conductive component, the conductive component having opposing substantially continuous straight linear outer lateral edges of the first and second conductive materials which span between the opposing outer lateral edges;
   second etching into both of the second material outer lateral edges to recess them inside of the first material outer lateral edges; and
   after the second etching, exposing the substrate to the thermal oxidizing atmosphere effective to grow an oxide layer over both of the outer lateral edges of the first and second conductive materials.

2. The method of claim 1 one of the first and second conductive materials comprises conductively doped polysilicon and the other comprises a refractory metal silicide.

3. The method of claim 1 wherein the second etching comprises wet etching.

4. The method of claim 1 wherein the first etching comprises dry etching and the second etching comprises wet etching.

5. The method of claim 1 wherein the second etching comprises wet etching with a basic solution.

6. The method of claim 1 wherein the second etching comprises wet etching with a solution comprising ammonium hydroxide and hydrogen peroxide.

7. The method of claim 1 comprising forming the second conductive material to be received over the first conductive material.

8. The method of claim 1 wherein the first etching is conducted to space the opposing linear outer lateral edges less than 1 micron apart from one another.

9. The method of claim 1 wherein the first etching is conducted to space the opposing linear outer lateral edges less than 1 micron apart from one another, and further comprising ion implanting into the substrate proximate outer lateral edges of the first and the second conductive materials after the exposing.

10. The method of claim 1 wherein the first etching is conducted to space the opposing linear outer lateral edges less than 1 micron apart from one another, the second etching and the exposing being effective to form the oxide layer to have opposing substantially continuous straight linear outer lateral edges over the first and second conductive materials.

11. The method of claim 10 wherein the opposing linear outer lateral edges of the oxide layer are formed to be less than 1 micron apart.

12. The method of claim 1 comprising forming a third insulative material over the first and second conductive materials, the first etching also etching the third insulative material to form the conductive component to have an insulative cap, the third insulative material having a lower oxidation rate than the second conductive material when exposed to the oxidizing atmosphere, the second etching recessing the second material outer lateral edges to within outer lateral edges of the third insulative material.

13. The method of claim 12 wherein the first etching is conducted to form the insulative cap to have opposing outer lateral edges which are substantially straight continuously linear with the outer lateral edges of the first and second conductive materials, and the first etching is conducted to space said opposing linear outer lateral edges less than 1 micron apart from one another.

14. The method of claim 12 wherein the first etching is conducted to form the insulative cap to have opposing outer lateral edges which are substantially straight continuously linear with the outer lateral edges of the first and second conductive materials, and the first etching is conducted to space the opposing linear outer lateral edges less than 1 micron apart from one another, and further comprising ion implanting into the substrate proximate outer lateral edges of the first and the second conductive materials after the exposing.

15. The method of claim 12 wherein the first etching is conducted to form the insulative cap to have opposing outer lateral edges which are substantially straight continuously linear with the outer lateral edges of the first and second conductive materials, and the first etching is conducted to space the opposing linear outer lateral edges less than 1 micron apart from one another, the second etching and the exposing being effective to form the oxide layer to have opposing substantially continuous straight linear outer lateral edges over the first and second conductive materials.

16. The method of claim 15 wherein the opposing linear outer lateral edges of the oxide layer are formed to be less than 1 micron apart.

17. The method of claim 1 further comprising:
   after the exposing, depositing an insulating layer to be received over the grown oxide layer over both opposing outer lateral edges; and
   anisotropically etching the insulating layer to form anisotropically etched spacers received over the grown oxide layer over both opposing outer lateral edges.

18. The method of claim 1 wherein the exposing is effective to fill the second material recesses formed by the second etching.

19. The method of claim 1 wherein the straight linear outer lateral edges extend entirely through the thicknesses of both the first and second conductive materials.

20. A semiconductor processing method of forming a transistor comprising:
   forming a gate dielectric layer, a doped silicon layer, a silicide layer and an insulating layer over a channel region of a substrate, the silicide layer having a higher oxidation rate than oxidation rates of the doped silicon layer and the insulating layer when exposed to a thermal oxidizing atmosphere;
   first etching the insulating layer, the silicide layer and the doped silicon layer to form a conductive gate stack having an insulating cap over the channel region, the gate stack having two opposing and respectively linearly aligned outer lateral edges of the insulating, silicide and doped silicon layers which span therebetween;
   second etching the silicide layer substantially selectively relative to the insulating cap and the doped silicon layer to recess outer lateral edges of the silicide layer to within outer lateral edges of both the insulating and doped silicon layers of the gate stack;
   after the second etching, exposing the substrate to the thermal oxidizing atmosphere effective to grow an oxide layer over outer lateral edges of the silicide and doped silicon layers;
   after the exposing, first implanting a dopant impurity into the substrate proximate the gate stack to form at least one of an LDD region or a halo region;
   after the first implanting, forming insulative material over the grown oxide layer over both opposing outer lateral edges; and
   after forming the insulative material, second implanting a dopant impurity into the substrate proximate the gate stack to form transistor source/drain regions.

21. The method of claim 20 wherein the first etching is conducted to space the opposing substantially linear outer lateral edges less than 1 micron apart from one another.

22. The method of claim 20 wherein the first etching is conducted to space the opposing linear outer lateral edges less than 1 micron apart from one another, the second etching and the exposing being effective to form the oxide layer to have opposing substantially continuous straight linear outer lateral edges over the insulating, silicide and doped silicon layers.

23. The method of claim 22 wherein the opposing linear outer lateral edges of the oxide layer are formed to be less than 1 micron apart.

24. The method of claim 20 wherein the second etching comprises wet etching.

25. The method of claim 20 wherein the first etching comprises dry etching and the second etching comprises wet etching.

26. The method of claim 20 wherein the second etching comprises wet etching with a basic solution.

27. The method of claim 20 wherein the second etching comprises wet etching with a solution comprising ammonium hydroxide and hydrogen peroxide.

28. The method of claim 20 wherein after forming the insulative material and before the second implanting, anisotropically etching the insulative material to form anisotropically etched spacers received over the grown oxide layer over both opposing outer lateral edges.

29. The method of claim 20 wherein the two opposing linear outer lateral edges extend entirely through the thicknesses of the insulating, silicide and doped silicon layers.

30. A method of forming an electronic component comprising:
   forming first and second conductive materials over a substrate, the second material having a higher oxidation rate than an oxidation rate of the first material when exposed to a thermal oxidizing atmosphere;
   first etching the first and second conductive materials to form a conductive component, the conductive component having at least one substantially continuous straight linear outer lateral edge of the first and second conductive materials;
   second etching into the at least one second material outer lateral edge to recess it inside of the first material outer lateral edge; and
   after the second etching, exposing the substrate to the thermal oxidizing atmosphere effective to grow an oxide layer over the at least one substantially continuous straight linear outer lateral edge of the first and second conductive materials.

31. The method of claim 30 further comprising:
   after the exposing, depositing an insulating layer to be received over the grown oxide layer over the at least one opposing outer lateral edge; and
   anisotropically etching the insulating layer to form an anisotropically etched spacer received over the grown oxide layer over the at least one opposing outer lateral edge.

32. The method of claim 30 wherein the exposing is effective to fill the second material recesses formed by the second etching.

33. The method of claim 30 wherein the at least one straight linear outer lateral edge extends entirely through the thicknesses of both the first and second conductive materials.

* * * * *